United States Patent

Hall et al.

[19]

[11] Patent Number: 5,960,306

[45] Date of Patent: Sep. 28, 1999

[54] PROCESS FOR FORMING A SEMICONDUCTOR DEVICE

[75] Inventors: Mark D. Hall; Gregory Steven Ferguson; Joel Patrick Mitchell, all of Austin, Tex.; Johanes P. D. Suryanata, Chandler, Ariz.

[73] Assignee: Motorola, Inc., Schaumburg, Ill.

[21] Appl. No.: 08/573,171

[22] Filed: Dec. 15, 1995

[51] Int. Cl.⁶ ............... H01L 21/44; H01L 21/8238; H01L 21/4763

[52] U.S. Cl. ............... 438/612; 438/228; 438/625; 438/627

[58] Field of Search ............... 437/197, 194, 437/189; 438/228, 612, 625, 627

[56] References Cited

U.S. PATENT DOCUMENTS

| | | | |
|---|---|---|---|
| 4,005,455 | 1/1977 | Watrous, Jr. et al. | 257/774 |
| 4,426,246 | 1/1984 | Kravitz et al. | 438/714 |
| 4,446,194 | 5/1984 | Candelaria et al. | 438/714 |
| 4,472,730 | 9/1984 | Ohta | 257/786 |
| 4,620,986 | 11/1986 | Yau et al. | 427/255.3 |
| 4,824,803 | 4/1989 | Us et al. | 438/612 |
| 4,911,786 | 3/1990 | Kindl et al. | 216/13 |
| 4,988,423 | 1/1991 | Yamamoto et al. | 438/625 |
| 5,120,671 | 6/1992 | Tang et al. | 438/257 |
| 5,244,817 | 9/1993 | Hawkins et al. | 438/64 |
| 5,374,503 | 12/1994 | Sachdev et al. | 430/323 |
| 5,380,401 | 1/1995 | Jones et al. | 438/712 |
| 5,409,777 | 4/1995 | Kennedy et al. | 428/411.1 |
| 5,421,891 | 6/1995 | Campbell et al. | 204/298.37 |
| 5,433,823 | 7/1995 | Cain | 438/702 |
| 5,443,998 | 8/1995 | Meyer | 438/439 |
| 5,512,130 | 4/1996 | Barna et al. | 156/643.1 |
| 5,514,616 | 5/1996 | Rostoker et al. | 438/228 |

FOREIGN PATENT DOCUMENTS

| | | | |
|---|---|---|---|
| 0589678A2 | 3/1994 | European Pat. Off. | H01L 23/02 |
| 07 058107 | 3/1995 | Japan . | |

OTHER PUBLICATIONS

Wolf et al., Silicon Processing for the VLSI Era: vol. 1, Process Technology, Lattice Press, pp. 407–408, 556, 1986.

*Primary Examiner*—Olik Chaudhuri
*Assistant Examiner*—Alonzo Chambliss
*Attorney, Agent, or Firm*—George R. Meyer

[57] ABSTRACT

A process for dry etching a passivation layer (42) of a semiconductor device is performed such that a low radio frequency (RF) power step is used when an underlying bond pad (22) is initially exposed and a high RF power step is used after the initial exposure. The process virtually eliminates or reduces the likelihood of bond pad (22) staining, particularly when a polyimide die coat layer (72) is subsequently formed over the semiconductor device (50).

31 Claims, 3 Drawing Sheets

5,960,306

PROCESS FOR FORMING A SEMICONDUCTOR DEVICE

FIELD OF THE INVENTION

The present invention relates to processes for forming semiconductor devices, and in particular, to processes for forming openings within passivation layers of semiconductor devices.

BACKGROUND OF THE INVENTION

Semiconductor devices need to be formed without bond pads that are stained. A problem with stained bond pads is that they decrease yield. The yield loss can be attributed to failing electrical or physical testing or failing a visual inspection because the stained bond pads do not look acceptable to customers. Stain bond pads are generally to be avoided because they only hurt yield.

Methods have been tried to reduce the likelihood of stained bond pads. One of the areas in which those skilled in the art have most closely focused has been the removal of a photoresist layer that is used on top of a passivation layer when forming bond pad openings. Much of the work has been related to changing parameters of the resist removal process including different equipment, organic chemical solvents, or other resist removal process parameters. However, even with all of these changes, stained bond pads can still be formed.

A need exists for forming a semiconductor device that can be formed consistently without having stained bond pads. A need also exists for forming a device without stained bond pads when a polyimide die coat is used over the device.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A process for dry etching a passivation layer of a semiconductor device is performed such that a high RF power step is used after a bond pad is initially exposed. The process virtually eliminates or reduces the likelihood of bond pad staining, particularly when a polyimide die coat is subsequently formed over the semiconductor device. The present invention is better understood with the embodiments described below.

Figure 1:
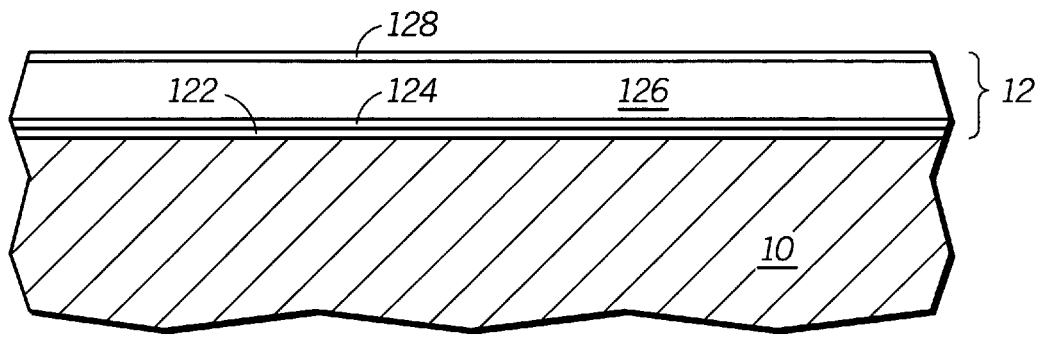
FIG. 1 includes an illustration of a portion of a semiconductor device including an interconnecting layer.
Figure 2:
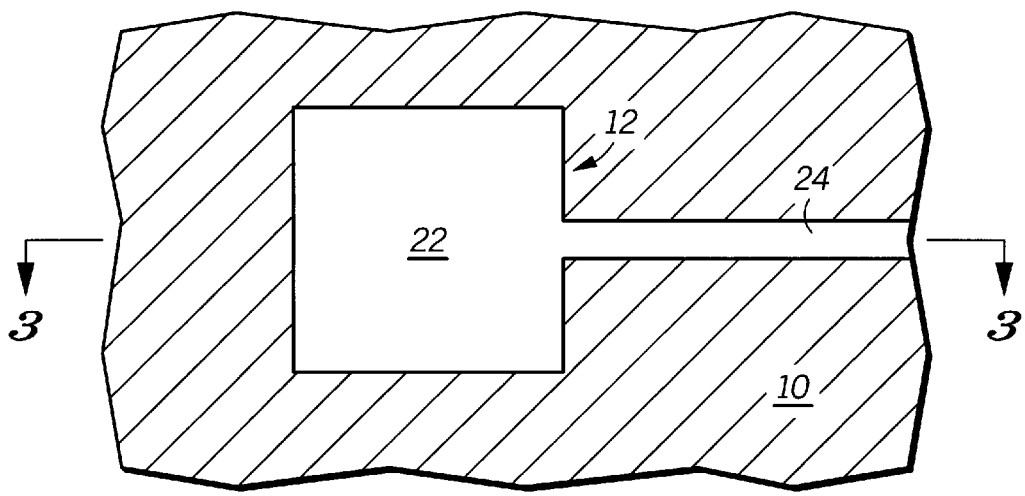
FIGS. 2 and 3 include illustrations of top and cross-sectional views, respectively, of the substrate of FIG. 1 after patterning the interconnecting layer.
Figure 3:
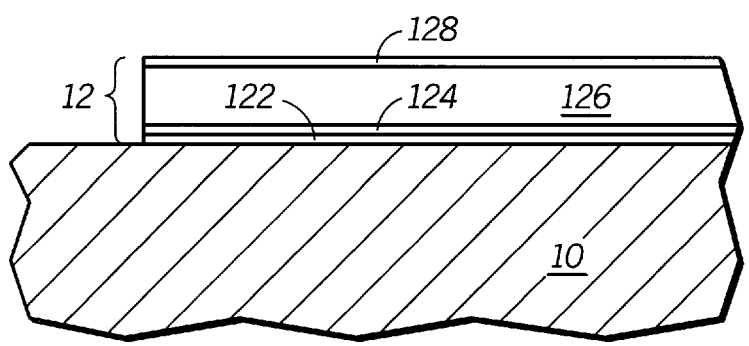

FIG. 1 includes a cross-sectional view of a portion of a semiconductor substrate having an insulating layer 10. In this embodiment, the semiconductor substrate is a monocrystalline silicon wafer having a 200 millimeter diameter. Insulating layer 10 is typically formed by depositing an oxide that can be doped or undoped. Circuitry is present under insulating layer 10, but is not shown in FIG. 1. Over the insulating layer 10 is formed an interconnecting layer 12 that includes an adhesion film 122, a barrier film 124, an aluminum-containing film 126, and an anti-reflective film 128. The adhesion film 122 typically includes titanium or the like, and the barrier film 124 typically includes titanium nitride or the like. The aluminum-containing film 126 typically includes aluminum and other impurities including silicon, copper, or the like, and the anti-reflective film 128 typically includes a nitride, such as titanium nitride, tungsten nitride, aluminum nitride, and the like. The interconnecting layer 12 is then patterned as shown in FIGS. 2 and 3 to form a bond pad 22 and an interconnect 24. The patterning is performed using a conventional method.

Figure 4:
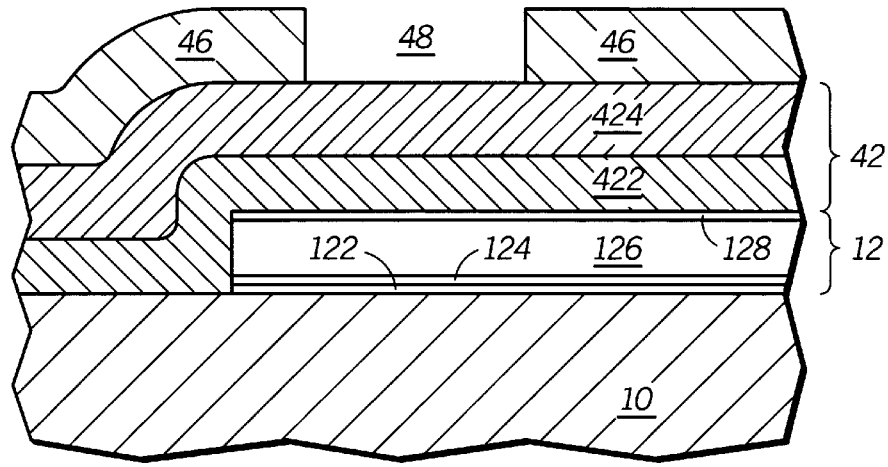
FIG. 4 includes an illustration of a cross-sectional view of the substrate of the FIGS. 2 and 3 after forming a passivation layer and a patterned resist layer.

A passivation layer 42 is then formed over the insulating layer 10 and interconnecting layer 12 as shown in FIG. 4. In this embodiment, the passivation layer 42 includes a doped oxide film 422 and a plasma-enhanced nitride film 424. The doped oxide film 422 typically includes phosphorus, boron, or the like. In an alternate embodiment, the passivation layer 42 can include a uniform or graded (discretely or continuously) composition of oxynitride. If a graded composition is used, the passivation layer has a refractive index closer to 2.0 as the distance from the insulating layer 10 increases. A resist layer is then formed and patterned over the passivation layer 42 to give a patterned resist layer 46 including a resist opening 48.

Figure 5:
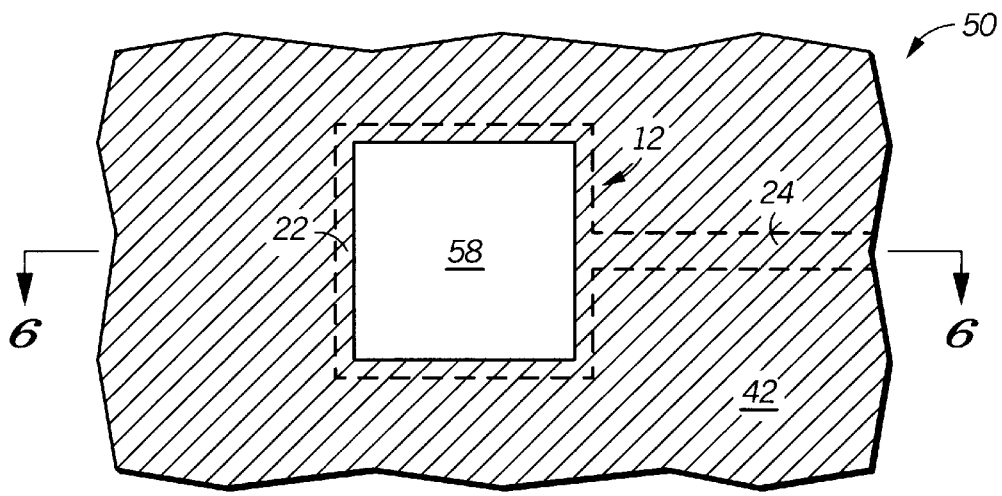
FIGS. 5 and 6 include illustrations of top and cross-sectional views, respectively, of the substrate of FIG. 4 after forming a bond pad opening through the passivation layer.
Figure 6:
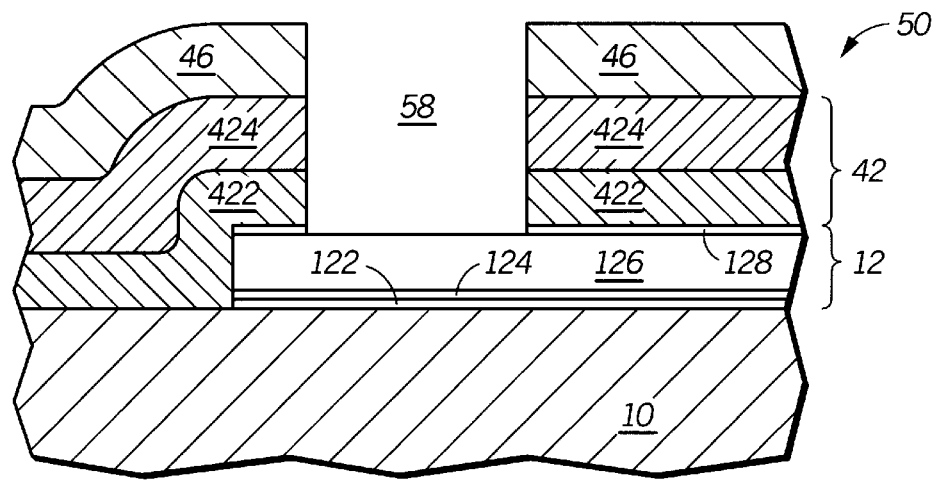

The passivation layer 42 is then etched to expose a portion of the bond pad 22 through bond pad opening 58 as seen in FIGS. 5 and 6. The portion of the bond pad 22 and interconnect 24 underlying the passivation layer 42 are illustrated by dashed lines in the semiconductor device 50 of FIG. 5. Typically, the passivation layer 42 is dry etched using plasma etching or reactive ion etching. Ion milling and sputter etching are typically avoided because of poor etch selectivity between the patterned resist layer 46 and the passivation layer 42. In one embodiment, all the passivation layer 42 is anisotropically etched to yield a bond pad opening 58 that is shown in FIG. 6. Alternatively, the plasma-enhanced nitride film 424 is partially or completely isotropically etched. The oxide film 422 is typically anisotropically etched. The dry etching typically continues through the anti-reflective film 128 until the aluminum-containing film 126 is exposed.

The dry etching sequence is performed in three steps. During the first step, the nitride film 424 is etched using an etching chemistry that includes argon, carbon tetrafluoride ($CF_4$), trifluoromethane ($CHF_3$), and oxygen. The RF power is in a range of approximately 1000–1500 watts. This step can be performed as a timed etch or using an endpoint signal indicating that the oxide film 422 has been reached. The second step etches the oxide film 422 using an etching chemistry that includes argon, carbon tetrafluoride ($CF_4$), trifluoromethane ($CHF_3$), and oxygen. The radio frequency (RF) power is in a range of approximately 700–900 watts.

The RF power during the etching of the oxide film 422 is typically kept below 1000 watts. The step is typically performed using an endpoint signal indicating that the aluminum-containing film 126 has been reached with a timed overetch.

The third step is performed using a chemistry that includes argon and carbon tetrafluoride ($CF_4$). The radio frequency (RF) power is in a range of approximately 1200–2000 watts and more often in a range of approximately 1600–1900 watts. In any event, the RF power is typically kept above 1000 watts. Although no upper RF power limit is known, damage to the aluminum-containing film or too much erosion of the resist layer 46 or damage to gate dielectrics may occur if the RF power is too high. The third step is typically timed and is performed for a time in a range of approximately 15–120 seconds, and more often in a range of approximately 45–75 seconds.

Clearly, the etch sequence above is just one way to perform the etch. Any of the three steps can be performed with fluorine-containing gases including $CF_4$, $CHF_3$, a fluorine-containing ethane having at least three fluorine atoms, nitrogen trifluoride ($NF_3$), sulfur hexafluoride ($SF_6$), or any combination thereof. Chlorine-containing gases including molecular chlorine ($Cl_2$), hydrogen chloride (HCl), boron trichloride ($BCl_3$), or the like should not be used any time the aluminum-containing film 126 is exposed. Usually, a chlorine-containing gas is not used during any portion of the dry etching sequence. If wafers having 300 millimeter diameters are used, the previously recited RF power numbers should be increased by 2.25 times to keep the RF power density about the same. To improve gas mixing before forming the plasma, the gas inlet can have two or three baffle plates in series. Each baffle plate typically has a plurality of openings.

Figure 7:
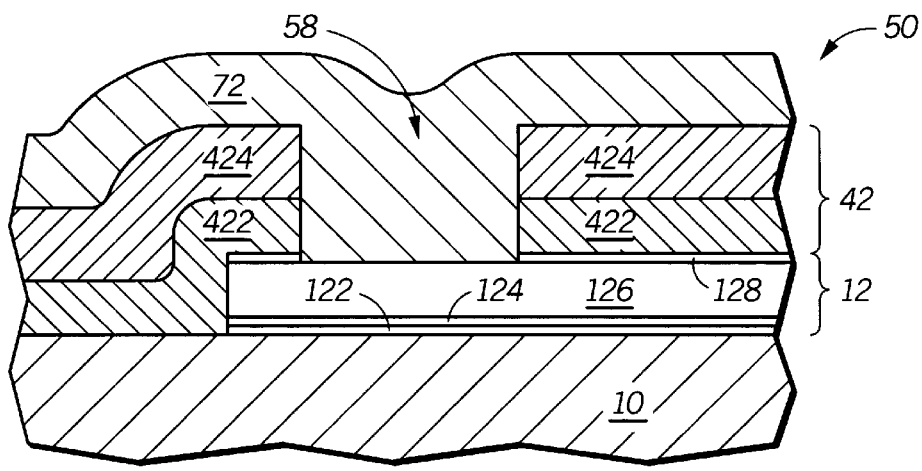
FIG. 7 includes an illustration of a cross-sectional view of the substrate of FIGS. 5 and 6 after coating a layer including polyamic acid over the device.
Figure 8:
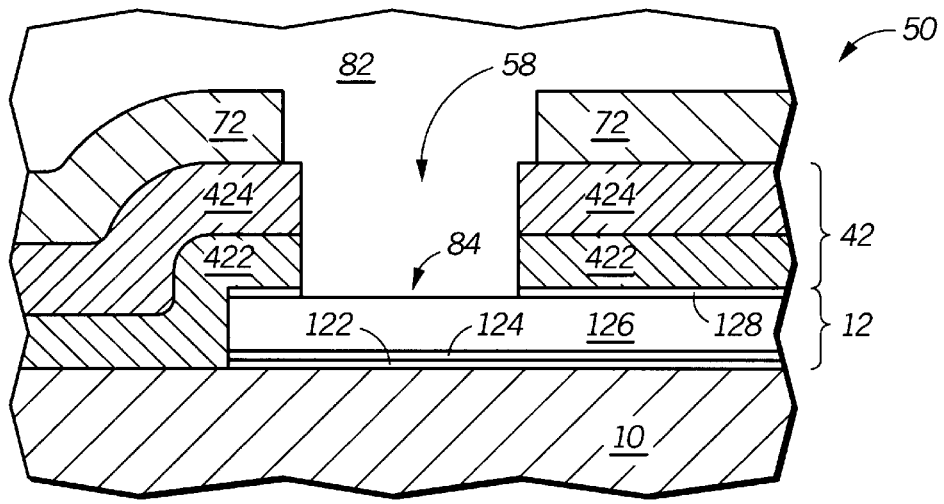
FIG. 8 includes an illustration of a cross-sectional view of the substrate of FIG. 7 during the developing of the layer including polyamic acid.
Figure 9:
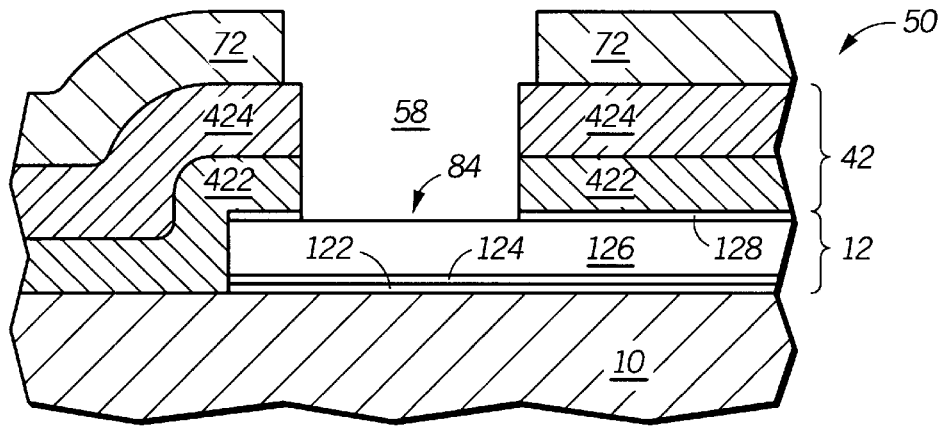
FIG. 9 includes a cross-sectional view of the substrate of FIG. 8 after curing the polyamic acid to form a polyimide die coat layer.

A die coat is then formed over the semiconductor device 50 to protect it against scratching or to increase the semiconductor device's alpha immunity that reduces the likelihood of soft errors. A layer 72 including polyamic acid is then formed over the passivation layer 42 and within the bond pad opening 58 as shown in FIG. 7. Layer 72 typically includes a photo sensitive material. The layer 72 is selectively exposed using a radiation source typically at a wavelength no greater than 248 nanometers and developed as shown in FIG. 8. FIG. 8 includes a developing solution 82, which is a liquid. The developing solution 82 is typically a base and includes a hydroxide, such as tetramethyl ammonium hydroxide (TMAH) or the like. It is seen that the solution 82 comes into direct contact with the exposed surface 84 of the aluminum-containing film 126. After developing, the layer 72 is then subjected to a thermal cycle that converts the polyamic acid to polyimide as shown in FIG. 9. This thermal cycle is also referred to as curing. No significant portion of layer 72 that now includes polyimide is in contact with the aluminum-containing film 126.

Embodiments of present invention reduce the incidence of staining of bond pads, which is particularly troublesome for bond pads that are connected to ground or $V_{SS}$. Although the mechanism that causes the staining is not fully understood, the TMAH in the developing solution 82 is believed to react with the aluminum-containing film 126. The higher RF power third step virtually eliminates or at least reduces bond pad staining compared to lower RF power, such as in a range of 600–800 watts. Still, other portions of the process including the second step that is performed at a lower RF power could affect staining.

Another benefit of the present invention is that it is relatively easy to integrate into an existing process flow and the process may need to be slightly modified from one piece of equipment to another based upon the actual equipment used. Also, the equipment may need to be modified for higher RF power, such as installing a plasma confining ring, but these modifications are not believed to be problematic.

In the foregoing specification, the invention has been described with reference to specific embodiments. However one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:
   forming a bond pad including a first bond pad film and a nitride film overlying the first bond pad film over a substrate;
   forming a passivation layer over the bond pad;
   forming a patterned resist layer over the passivation layer dry etching the passivation layer to form an opening to expose a portion of the bond pad, wherein the dry etching:
      is performed after the step of forming the patterned resist layer;
      includes a first portion and a second portion;
      the first portion is performed at a power no greater than 1000 watts and etches through the nitride film to expose the first bond pad film; and
      the second portion is performed at a power greater than 1000 watts while the first bond pad film is exposed within the opening.

2. The process of claim 1, wherein the step of forming the passivation layer is performed such that the passivation layer includes a material selected from a group consisting of oxide, nitride, and oxynitride.

3. The process of claim 1, wherein the step of forming the passivation layer is performed such that the passivation layer includes a first passivation film and a second passivation film that overlies the first passivation film, wherein the first passivation film includes a phosphorous doped oxide and the second passivation film includes a plasma-enhanced nitride.

4. The process of claim 3, wherein the step of dry etching is performed such that the first passivation film is etched isotropically and the second passivation film is etched anisotropically.

5. The process of claim 1, wherein the step of dry etching is performed such that all of the etching is performed anisotropically.

6. The process of claim 1, wherein the step of dry etching is selected from a group consisting of plasma etching and reactive ion etching.

7. The process of claim 1, wherein the step of dry etching is performed such that a chlorine-containing gas is not used during any portion of the step.

8. The process of claim 1, further comprising a step of forming a layer including polyimide over the passivation layer after the step of dry etching.

9. The process of claim 1, wherein the step of forming the bond pad is performed such that the bond pad includes aluminum.

10. The process of claim 1, wherein the step of dry etching further comprises a third portion performed at a power of at least 1000 watts before the first portion.

11. The process of claim 10, wherein:
the first portion is performed using a fluorine-containing gas at a power no greater than 900 watts;
the second portion is performed using a fluorine-containing gas at a power of at least 1600 watts while the first bond pad film is exposed; and
the third portion is performed using a fluorine-containing gas at a power in a range of approximately 1000–1500 watts.

12. The process of claim 11, wherein:
each of the first and third portions includes carbon tetrafluoride and trifluoromethane; and
the second portion is performed using carbon tetrafluoride as an only fluorine-containing gas.

13. The process of claim 1, wherein:
the first bond pad film includes aluminum; and
the second portion is performed for at least 15 seconds.

14. A process for forming a semiconductor device comprising the steps of:
forming a bond pad including an aluminum-containing film over a substrate;
forming a passivation layer over the bond pad;
dry etching the passivation layer to form an opening to expose the bond pad, wherein the dry etching is performed at a power greater than 1000 watts while the aluminum-containing film is exposed;
forming a layer including polyamic acid over the passivation layer and within the opening;
selectively exposing the layer including polyamic acid to a radiation source; and
selectively removing portions of the layer including polyamic acid using a base, wherein the base contacts the aluminum-containing film.

15. The process of claim 14, wherein the step of forming the passivation layer is performed such that the passivation layer includes a material selected from a group consisting of oxide, nitride, and oxynitride.

16. The process of claim 14, wherein the step of forming the passivation layer is performed such that the passivation layer includes a first film and a second film that overlies the first film, wherein the first film includes a phosphorous doped oxide and the second film includes a plasma-enhanced nitride.

17. The process of claim 16, wherein the step of dry etching is performed such that the first film is etched isotropically and the second film is etched anisotropically.

18. The process of claim 14, wherein the step of dry etching is performed such that all of the etching is performed anisotropically.

19. The process of claim 14, wherein the step of dry etching is selected from a group consisting of plasma etching and reactive ion etching.

20. The process of claim 14, wherein the step of dry etching is performed such that a chlorine-containing gas is not used during any portion of the step.

21. The process of claim 14, wherein the step of dry etching includes a first portion and a second portion, wherein the first portion is performed at a power no greater than 1000 watts and the second portion is performed at a power of at least 1200 watts for at least 15 seconds while the bond pad is exposed.

22. The process of claim 14, wherein:
the step of dry etching comprises a first portion, a second portion, and a third portion;
the first portion is performed using a fluorine-containing gas at a power in a range of approximately 1000–1500 watts;
the second portion is performed using a fluorine-containing gas at a power no greater than 900 watts; and
the third portion is performed using a fluorine-containing gas at a power of at least 1600 watts while the aluminum-containing film is exposed.

23. The process of claim 22, wherein:
each of the first and second portions includes carbon tetrafluoride and trifluoromethane; and
the third portion is performed using carbon tetrafluoride as an only fluorine-containing gas.

24. The process of claim 14, wherein the base includes tetramethyl ammonium hydroxide.

25. The process of claim 14, further comprising a step of curing the layer including polyamic acid to convert polyamic acid to polyimide.

26. A process for forming a semiconductor device comprising the steps of:
forming a bond pad over a substrate, wherein the substrate has a 300 mm diameter;
forming a passivation layer over the bond pad;
dry etching the passivation layer to form an opening to expose a portion of the bond pad, wherein the dry etching:
is performed at a power greater than 2250 watts; and
exposes the bond pad.

27. The process of claim 26, wherein:
the bond pad includes a first film and a nitride film overlying the first film; and
the process further comprising a step of forming a patterned resist layer over the passivation layer; and
the step of dry etching is performed at a power of at least 2250 watts while the bond pad is exposed for at least 15 seconds.

28. The process of claim 27, further comprising steps of:
forming a layer including polyamic acid over the passivation layer and within the opening after the step of dry etching;
selectively exposing the layer including polyamic acid to a radiation source; and
selectively removing portions of the layer including polyamic acid using a base, wherein the base contacts the first film that is an aluminum-containing film.

29. The process of claim 27, wherein:
dry etching includes a first portion, a second portion that is performed after the first portion, and a third portion that is performed after the second portion;
the first portion is performed using a fluorine-containing gas at a power in a range of approximately 2250–3375 watts;
the second portion is performed using a fluorine-containing gas at a power no greater than 2025 watts; and
the third portion is performed using a fluorine-containing gas at a power of at least 3600 watts while the first film is exposed.

30. The process of claim 29, wherein:
each of the first and second portions includes carbon tetrafluoride and trifluoromethane; and the third portion is performed using carbon tetrafluoride as an only fluorine-containing gas.

31. The process of claim 26, wherein the step of forming the passivation layer is performed such that the passivation layer includes a first film and a second film that overlies the first film, wherein the first film includes a phosphorous doped oxide and the second film includes a plasma-enhanced nitride.

* * * * *